US007622938B2

(12) United States Patent
Gröninger

(10) Patent No.: US 7,622,938 B2
(45) Date of Patent: Nov. 24, 2009

(54) CONTACT UNIT FOR A DEVICE TO PLACE A PART INTO OPERATION, TESTING DEVICE, AND METHOD FOR PLACING INTO OPERATION OF AND TESTING A PART

(75) Inventor: Horst Gröninger, Maxhütte (DE)

(73) Assignee: Infineon Technologies, AG, Munich (DE)

( * ) Notice: Subject to any disclaimer, the term of this patent is extended or adjusted under 35 U.S.C. 154(b) by 332 days.

(21) Appl. No.: 11/677,347

(22) Filed: Feb. 21, 2007

(65) Prior Publication Data

US 2008/0188094 A1 Aug. 7, 2008

(30) Foreign Application Priority Data

Feb. 7, 2007 (DE) ...................... 10 2007 006 196

(51) Int. Cl.
*G01R 31/02* (2006.01)
*G01R 31/28* (2006.01)

(52) U.S. Cl. ..................................................... 324/758

(58) Field of Classification Search .............. 324/158.1, 324/750–758, 760–765; 209/571, 573; 285/114–116, 285/148.3
See application file for complete search history.

(56) References Cited

U.S. PATENT DOCUMENTS 5,469,074 A 11/1995 Drabenstadt et al. ........ 324/758
6,064,218 A 5/2000 Godfrey et al.
6,756,798 B2 6/2004 Saulnier et al. ............. 324/754
6,774,650 B2 * 8/2004 Maruyama et al. .......... 324/754
7,078,922 B2 * 7/2006 Kirby ......................... 324/755

* cited by examiner

*Primary Examiner*—Jermele M Hollington
*Assistant Examiner*—Trung Q Nguyen
(74) *Attorney, Agent, or Firm*—Banner & Witcoff, Ltd.

(57) ABSTRACT

A contact unit is provided. The contact unit is adjusted in order to create an electric contact in a test device and comprises an arrangement for contact guides (140; 340'; 440'), and a connection unit (142; 442) with the contact unit having a predetermined breaking point (444), which is arranged in order to separate an electric contact between the contact guides of the arrangement of contact guides.

19 Claims, 3 Drawing Sheets

CONTACT UNIT FOR A DEVICE TO PLACE A PART INTO OPERATION, TESTING DEVICE, AND METHOD FOR PLACING INTO OPERATION OF AND TESTING A PART

CROSS-REFERENCE TO RELATED APPLICATIONS

This application claims priority from German Patent Application No. 10 2007 006 196.1, which was filed on Feb. 7, 2007, and is incorporated herein by reference in its entirety.

TECHNICAL FIELD

Embodiments of the invention generally relate to testing parts. In particular, they relate to the contacting for a direct board assembly of parts, contacts for contacting parts having a test base, and a method for placing into operation of and testing a part. In particular, they relate to a contact unit for contacting parts, a device for initial operation of an electronic component, a test base for producing an electric contact between a part and a board, and a method for placing a part into operation.

BACKGROUND

Electronic parts and chips are tested during production or subsequent to their production. Automatic test equipment (ATE) can be used, for example, to subject chips or electronic parts to marginal tests, parameter tests, or function tests. Here, the ATE must have a device under test (DUT), adjusted to the contacting devices.

Further, it has been found, among other things, that errors at parts occur at an early phase of the use of the parts. Therefore, a burn-in test is performed for some electronic parts. This way it can be achieved that the probability for an error during the use of an electronic part in a device is reduced.

The requirements set for test methods increase the production costs. Therefore, a quick, cost-effective, and robust testing device is desired.

SUMMARY

A contact unit according to a first embodiment may be adjusted to produce an electric contact, and may include an arrangement of contact guides and a connecting unit, which connects the contact guides to each other, wherein the contact unit is provided with at least one predetermined breaking point, which is arranged for interrupting an electric contact between the contact guides of the arrangement of contact guides.

BRIEF DESCRIPTION OF THE DRAWINGS

In the following, embodiments of the invention are described using the exemplary embodiments shown in the attached figures. However, the invention is not limited to the concretely described exemplary embodiments but can be modified and amended in a suitable manner. The range of the invention includes several features and feature combinations of one exemplary embodiment to be combined with features and feature combinations of another exemplary embodiment.

DETAILED DESCRIPTION

According to another embodiment, a device for placing of an electric part into operation is provided including a contact unit. The contact unit is adjusted in order to create in a device for initial operation an electric contact, and includes an arrangement of contact guides and a connection unit, which connects the contact guides to each other, wherein the contact unit being provided with a predetermined breaking point, which is arranged in order to interrupt an electric contact between contact guides of the arrangement of contact guides.

According to another embodiment a test base for creating an electric contact between an electric part and a board is provided. The test base includes: a contact unit including an arrangement of contact guides, and a connecting unit, which connects the contact guides with each other, with the arrangement of contact guides and the connection unit being embodied in one piece.

According to another embodiment a method for testing a component is shown in a device for initial operation. The method includes: arranging a component in the device for initial operation, arranging an arrangement of contact guides in the device for initial operation, pressing the arrangement of contact guides onto a circuit board, separating the contact guides of the arrangement of contact guides, and placing the component into operation.

The invention is described in the following using the exemplary embodiments.

In order to simplify the understanding of the description, in the following identical reference numbers are used when identical elements are addressed, which are used commonly in the figures. It is provided for the elements used in one embodiment also to be used in another embodiment without this having to be individually mentioned each time.

Figure 1:
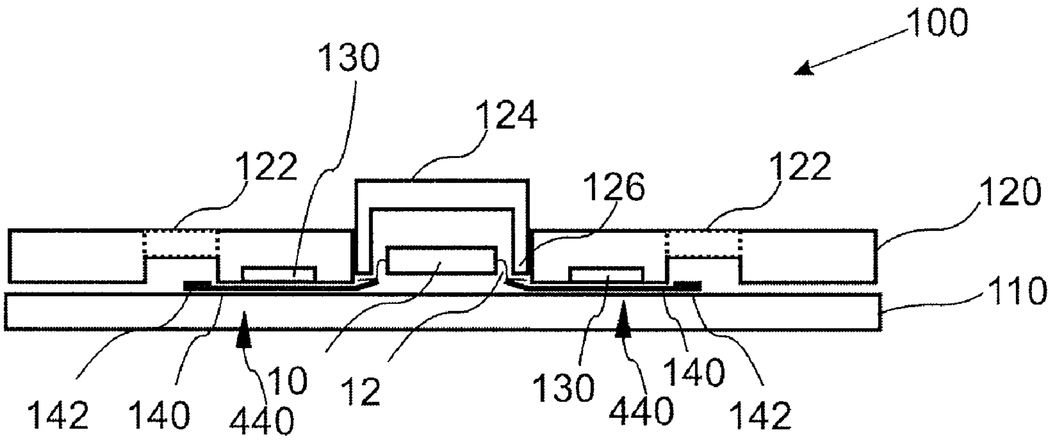
FIG. 1 shows a part of a test base for testing an electronic part on a DUT-board with contacts according to the embodiments described here.

FIG. 1 shows an embodiment of a test base 100. The test base 100 includes a base plate 120. The base plate 120 is arranged in reference to the circuit board 110 such that a contact unit 440, having an arrangement of contact guides 140, positioned between the base plate 120 and the circuit board 110, is electrically connected to the circuit board 110 via appropriate contacts.

The circuit board 110 is a board for testing a part 10 (device under test, DUT). The circuit board 110 is therefore also called DUT-board. According to an embodiment the base plate 120 has a recess, in which the part 10 can be arranged. A device for initial operation or a testing device, e.g., in the form of a test base 100, may have a plunger 124, shown schematically in FIG. 1.

According to another embodiment the plunger 124 may be arranged mobile in reference to the base plate 120. In FIG. 1 the plunger 124 is mobile in the vertical direction in reference to the base plate 120.

In FIG. 1 the plunger 124 comprises a contact wall 126. The contact wall 126 pressurizes a connection between the connection elements 12 of the part 10 and one contact guide of the arrangement of contact guides 140 each, when the plunger 124 is moved downwards. Therefore, a connection develops of the part 10, via the connection elements 12 of the part 10, and via contact guides of the arrangement of contact boards 140 to the circuit board 110. Here, the contact wall 126 of the plunger 124 ensures the connection of the contact elements 12 to the contact guides of the arrangement of contact guides 140.

Furthermore, a contact is created between the arrangement of contact guides 140 and the circuit board 110 by the base plate 120 of the test base 100 pressurizing the arrangement of contact guides 140 and the respective contacts on the circuit board 110.

A contact unit with the arrangement of contact guides 140 and with a contact guide-connection unit 142 is shown in FIG. 1. The contact guide-connection unit 142 connects the contact guides. The connection serves to fix the relative position of the contact guides during assembly. The connection is electrically conducting. According to an embodiment the arrangement of contact guides includes at least eight contact guides. According to another embodiment the arrangement of contact guides includes at least 17 contact guides. Within the scope of a continued integration of circuit boards, according to another embodiment it is also possible to provide an even higher number of contact guides, e.g., 200, in the arrangement of contact guides 140, which are fixed by the contact guide-connection element 142 to each other and in predetermined positions.

According to an embodiment, the contact unit is provided with at least one predetermined breaking point 444 (not shown in FIG. 1) in the contact unit and/or one predetermined breaking point for each contact guide. They are each embodied between the contact guide and the contact guide-connection unit. Alternatively, they may also be located in the area of the contact guides, according to another embodiment. Here, such a predetermined breaking point and/or such predetermined breaking points may also be embodied at the side of the contact guides facing the connection unit.

The predetermined breaking point and/or the predetermined breaking points allow to separate the contact guides and to electrically isolate them from each other before the part 10 is tested in the test arrangement 100. This way an individual connection develops for each contact element 12 of the part 10 to a respective contact on the circuit board 110. The position of the predetermined breaking point and/or the predetermined breaking points is marked by line 144 in FIG. 2.

According to the embodiments described here it is possible to integrate the arrangement of contact guides 140 to the contact guide-connection unit 142 in its entirety into the system. The contact guide-connection unit here represents a desired relative position of the individual contact guides in reference to each other. Before a test of part 10 occurs in the test base 100 the contact guide-connection unit 142 can be removed. This provides contact guides electrically separated from each other for the individual connection elements 12 of part 10.

In FIG. 1 an opening 122 is provided as a window inside the base plate 120. By this window it is possible, before a test of the part occurs, to influence the contact guide-connection device and to remove it from the system. As shown in FIG. 1, the opening 122 may be provided at the top of the base plate 120 for removing the contact guide-connection element according to a first embodiment. According to other embodiments a respective opening may also be provided at a side of the base plate or at another appropriate position of the test base 100 such that a separation of the contact guides occurs by removing the contact guide-connection unit at the predetermined breaking point provided.

Figure 2:
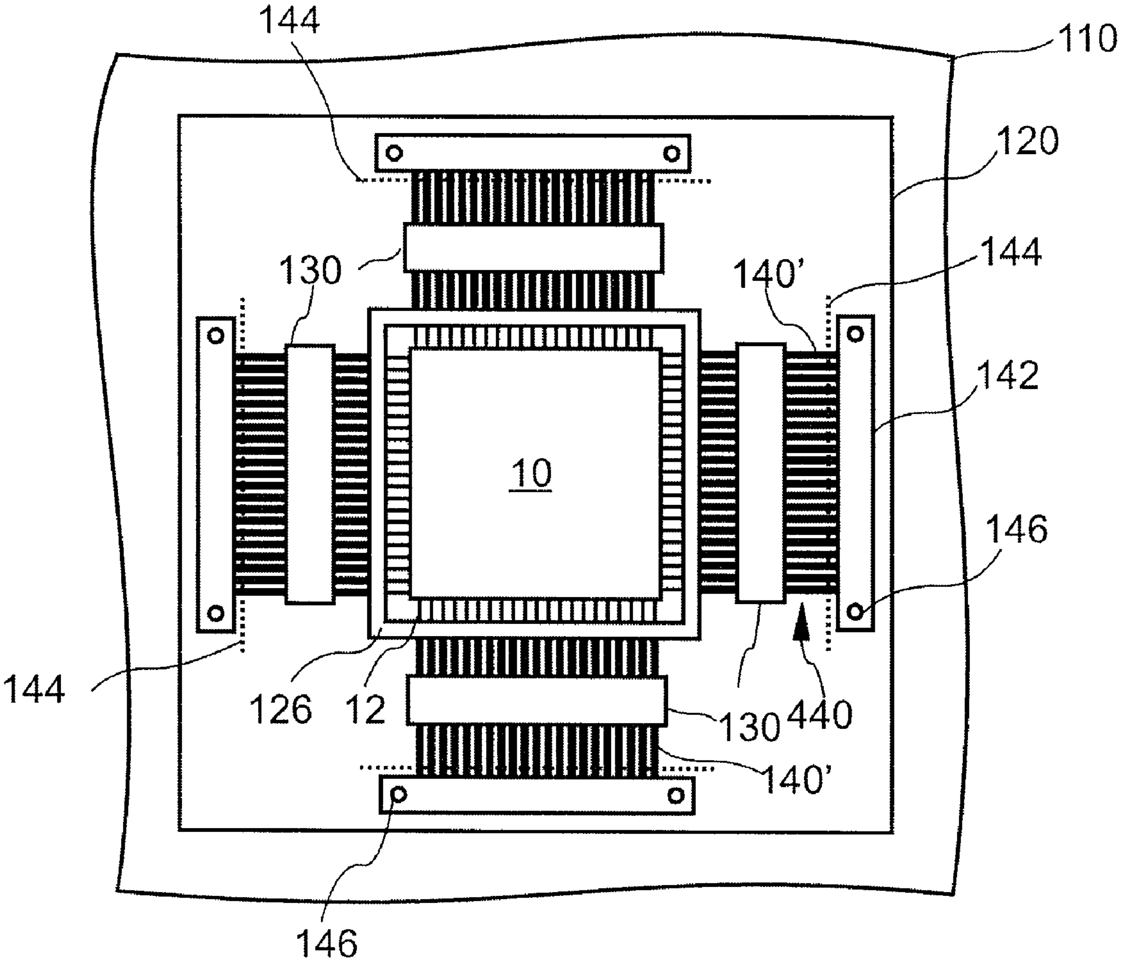
FIG. 2 shows a top view of the test base of FIG. 1.

Furthermore, in FIGS. 1 and 2 a bar-shaped contact guide-fixation unit 130 is shown. The contact guide-fixation unit 130 pressurizes the arrangement of the contact guides 140 when the base plate 120 of the test base 100 is placed onto the circuit board 110. Hereby the contact guides of the arrangement of contact guides 140 are held in their position, even when the contact guide-connection unit 142 has been removed by breaking the predetermined breakage point. According to an embodiment the contact guide-fixation unit 130 can be provided in one piece inside the base plate 120.

According to another embodiment, as shown in FIG. 2, the contact guide-fixation unit 130 may also comprise several contact guide-fixation units 130, each fixing a multitude of contact guides.

According to another embodiment the contact guide-fixation unit and/or the multitude of contact guide-fixation units 130 comprise an elastomer. By the elastomer the contact guides 140 are pressed onto the circuit board 110. This way it is ensured that minor irregularities entered into the system via the circuit board 110, the base plate 120, the test base 100, or via the arrangement of contact guides 140, do not lead to individual contact guides not being held sufficiently in the position by the contact guide-fixation unit 130.

By the elasticity of an elastomer it can further be ensured that at a predetermined deformation of the elastomer all contact guides of the arrangement of contact guides is held in position to a sufficient extent. According to an embodiment silicon rubber may be used as the elastomer. According to another embodiment other materials may also be used having a hardness ranging from 40° shore to 80° shore.

According to embodiments described here the contact guide-fixation unit 130 provided is made from an electrically non-conducting material. This way an isolation between the individual contact guides develops, which are in contact to the same contact guide-fixation unit.

According to other embodiments it is possible for the contact guide-fixation unit 130 or the contact guide-fixation units 130 to be inserted into the base plate 120 of the test base 100.

Analogously to FIG. 1, FIG. 2 shows, for example, the circuit board 110, the part 10 with the contact elements 12, and the contact wall 126 of the plunger. In the top view shown in FIG. 2 the position of the predetermined breakage points is shown by line 144. Further, in FIG. 2 the contact guide-fixation units 130 are discernible.

As discernible in FIG. 2, the contact guide-connection unit 142 can be provided with one or more alignment units 146, according to an embodiment. According to an embodiment the alignment unit 146, which is provided in the contact guide-connection unit 142, can be provided, for example, in form of a hole or in form of holes. These holes can be placed onto pins or protrusions on the surface of the circuit board 110. This way an alignment of the arrangement of contact guides 140 and thus the individual contact guides 140' can be realized prior to their separation.

According to another embodiment, for example, it is also possible to align the alignment unit 146 to the base plate 120 by one or more fitting pins or other adjustment features.

Figure 3:
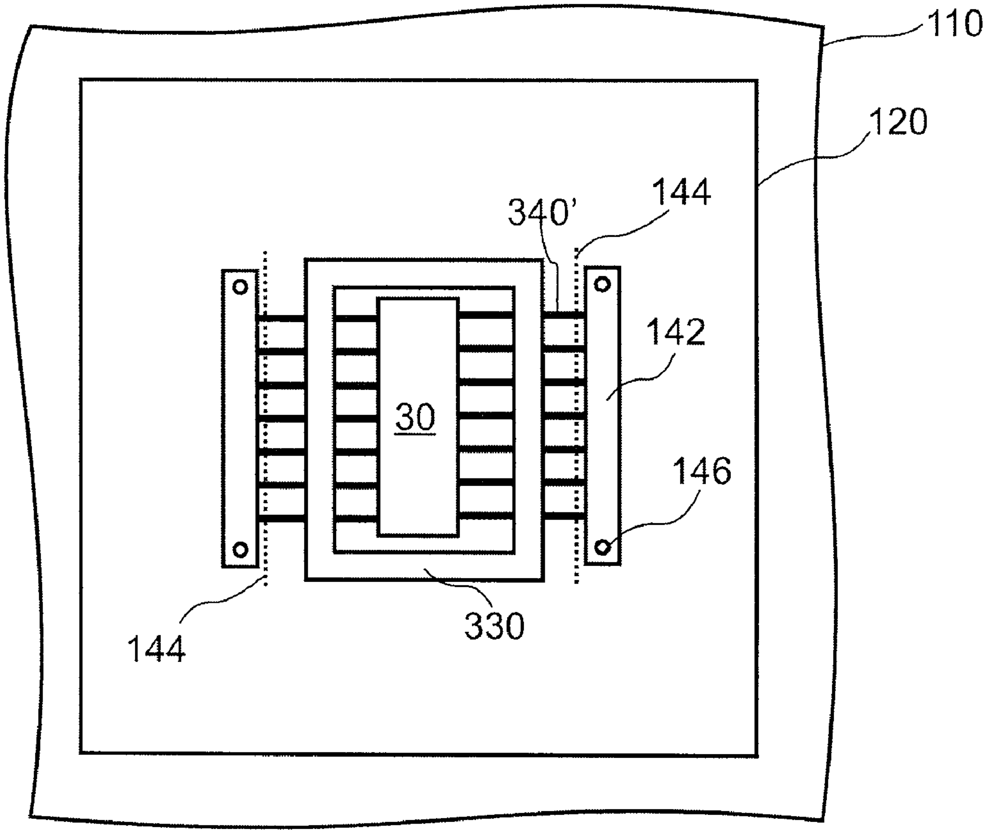
FIG. 3 shows a top view of a schematic representation of a DUT-board, an electronic part, and its contacting according to the embodiments described here.

FIG. 3 shows schematically another embodiment and provides a device for initial operation of and/or testing a part 30 on a circuit board 110. In FIG. 3 the arrangement of contact guides 340' with seven contact guides 340' each is provided. The corresponding connection unit for the contact guides 142 can be provided with alignment units 146, for example. Furthermore, the contact guides 340 are each provided with a predetermined breaking point at the positions indicated by line 144. According to an embodiment shown in FIG. 3 a contact guide-fixation unit 330 is provided, which is embodied in one piece and is adjusted to fix together all contact guides of the test arrangements and/or to hold them in their position.

According to another embodiment the contact guides-fixation unit 330 comprises an elastomer so that the contact guides are pressed elastically to the circuit board and a stable positioning of all contact guides can also be provided after the separation of the contact guides 340'. An elastomer, such as, e.g., silicon rubber, compensates irregularities which otherwise could lead to the risk that individual contact guides 340' cannot be sufficiently fixed. Using an elastomer material it can be ensured that minor irregularities that enter into the system via the circuit board 110, the base plate 120, the test base 100, or the arrangement of contact guides 140 do not lead to individual contact guides being insufficiently held in their position by the contact guide-fixation unit 130.

The elasticity of an elastomer can ensure that all contact guides of the arrangement of contact guides are sufficiently held in their position at a certain deformation of the elastomer. According to one embodiment silicon rubber can be used as the elastomer. According to other embodiments other materials may also be used, for example having a hardness ranging from 40° shore to 80° shore.

A plunger having an appropriate contact wall for creating or improving a contact of a contact element of the part 30 to a contact guide of the test devices is not shown in FIG. 3, for reasons of clarity. One skilled in the art will recognize, however, that a connection of the part 30 and/or its contact elements to the contact guides 340' of the arrangement of contact guides can be accomplished analogously to one of the other embodiments.

Figure 4A:
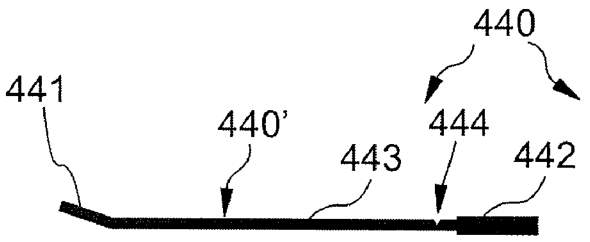
FIG. 4*a* shows a side view of a contact unit having an arrangement of contact guides and a connection of said contact guides according to the embodiments described here.

FIG. 4*a* shows schematically a side view of an arrangement of contact guides 440. The arrangement of contact guides shows a contact guide 440' in a side view. FIG. 4*a* further shows a cross-section through the contact guide-connection unit 442 and a predetermined breaking point 444.

Before the contact unit 440 is separated by breaking the predetermined breaking point 444 and thus the arrangement of contact guides is separated from the contact guide-connection unit the individual contact guides 440' are electrically connected to each other via the contact guide-connection unit. This condition of the electrical connection is undesired for the test phase; therefore, prior to beginning the testing of a part, the contact guide-connection unit 442 is separated from the contact guides 440'.

According to an embodiment, this provides for a separation of the contact unit 440, embodied in one piece. Therefore, according to the embodiments shown here a contact unit 440 can be produced in a cost-effective and simple manner. It can be used for a robust and easily adjustable contact to the direct board assembly for parts with peripheral contacts (e.g., QFP, SOG, QRN) and additionally offers the full functionality of the individual contacting of individual contact elements of a part, after the contact guide-connection unit 442 has been separated from the contact unit 440.

According to the embodiments described here a contact unit may be produced as follows. The contact unit comprises a material, which may be, for example, spring steel or copper beryllium. Here, the comb-shaped arrangement of contact guides including the connection unit for the contact guides is produced from sheet metal. According to an embodiment this can occur via laser cutting. According to another embodiment the contact unit can thereby be made by wire-cut EDM.

Figure 4B:
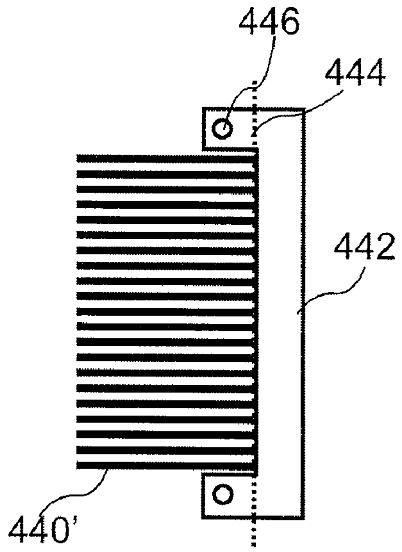
FIG. 4*b* shows a top view of a contact unit having an arrangement of contact guides and a connection of the contact guides according to the embodiments described here.

A top view of the contact unit 440 shown in FIG. 4*b* shows the comb-shaped structure of the individual contact guides 440'. According to an embodiment the contact guide-connection unit is embodied U-shaped. Alignment units 446 in the form of openings that can be aligned to pins or protrusions, are arranged in the U-side parts. Further discernible are the positions of the predetermined breaking points indicated by line 444. According to another embodiment the position of the predetermined breaking point can be arranged such that the contact guide-connection unit is not interrupted when the contact unit is separated at the predetermined breaking point.

According to an embodiment that can be used for the test base, described within the scope of this application and embodiments, the contact unit, i.e., the arrangement of contact guides and contact guide-connection unit, comprises spring steel. According to another arrangement, the contact unit, i.e., the arrangement of contact guides and the contact guide-connection unit, comprises copper beryllium.

According to additional embodiments the contact guides 440' have a thickness (in FIG. 4*a*: a height) ranging from 80 μm to 200 μm. According to additional embodiments the thickness of the guides may amount to 100 μm or 150 μm. A predetermined breaking point as shown in FIG. 4*a* in the form of a wedge-shaped tapering 444 of the contact guide, therefore comprises according to an embodiment a laser ablation reducing the thickness of the contact guide by 30% to 70%. According to a typical additional embodiment, for example, 50% of the material thickness of the contact guides is removed by laser radiation along a line.

According to another embodiment a contact guide 440', as shown in FIG. 4*a*, includes a horizontal part 443 and an angled part 441. Here, the horizontal part 443 serves to be placed on a circuit board and to create a contact of the contact guides to a corresponding contact on the circuit board. The angled part 441 serves to an elastic contacting of the contact guide 440' to a contact element of a part. The angled part 441 can be connected to a contact element of a part 30 such that a contact wall of a plunger of the part 30 presses from above onto the angled part 441 of the contact guide 440. Here it is possible for the plunger, for example, to act with such a pressure that the angled part 441 of the contact guides is elastically deformed.

An embodiment of a method for testing a part can be explained with reference to FIG. 5. First, a contact unit is provided in step 510. The contact unit is provided with an arrangement of contact guides connected to each other by a contact guide-connection unit. According to another, typical embodiment the contact unit is embodied in one piece. Therefore, an adjustment of the contact unit including all contact guides can be performed in step 511 in a single step. This can occur, e.g., in the alignment unit of the contact unit being placed on corresponding features of a circuit board. Alternatively, it is possible, for example, to align the contact unit to the base plate using the test device.

The contact unit including all contact guides is therefore located in a position provided for the later performance of tests. Further, in step 512, the part to be tested in the test devices is provided. In step 513 the contact guides of the contact unit are fixed. This occurs, e.g., by one or more contact guide-fixation units pressing the contact guides against the circuit board such that all contact guides are individually held in their target position. As soon as the individual contact guides are fixed (step 513), in step 514 the contact guide-connection unit can be separated from the contact unit. This may occur, for example, by breaking the predetermined breaking point. The contact guide-connection unit of the contact unit is subsequently removed from the test system. In step 515 the part is contacted so that contact elements of the part are connected to the respective contact guides in an electric connection. This can occur, for example, in that a plunger with contact walls is pressed downwards. This creates a contact between the connectors of a part and the respective contact guides. Via another contact of the contact guides to the circuit board, which has been created during the fixation of the contact guide, the part according to step 515 is electrically connected to the circuit board in a predetermined manner. In step 516 the part can now be tested.

Figure 5:
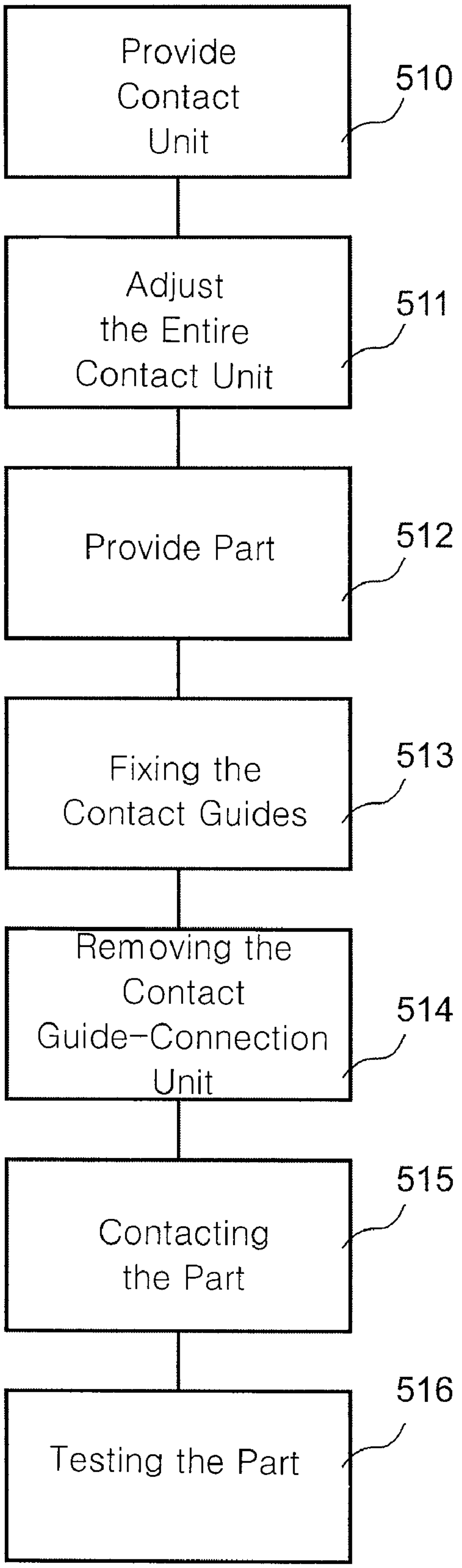
FIG. 5 shows a flow chart for illustrating a method for testing an electronic part.

The sequence of the method shown in FIG. 5 can be varied for realizing additional embodiments. Here, a multitude of variations is available as long as step 514 is performed after step 513.

According to the embodiments described here a contact unit can be provided, which is produced as follows. The contact unit comprises a material, such, as e.g., spring steel or copper beryllium. Here the comb-shaped arrangement of the contact guides including the connection unit for the contact guides is produced from a sheet metal. According to an embodiment this can occur by laser cutting. According to another embodiment the contact unit can be produced by wire-cut EDM.

The contact guides of the contact unit are connected to each other by the connection unit of the contact guides until the test devices, e.g., a test base, are integrated. The comb-shaped arrangement of contact guides and the connection unit of the contact guides, e.g., produced from sheet metal, comprise at this time an electric contact between the individual contact guides. In order to separate the contact guides from each other such that the electric contacts between the individual contact guides are separated a predetermined breaking point is provided in the contact unit. The predetermined breaking point can be created by laser cutting, according to an embodiment.

According to embodiments for producing the contact unit and embodiments of the contact unit both the contact unit and/or the predetermined breaking point can be produced by laser ablation or laser cutting.

In order to allow sheet metal to be structured quickly and precisely they can be processed via laser micro-ablation. For this purpose a micro-structuring arrangement can be used having a frequency-doubled (532 nm) or frequency-tripled (355 nm) Nd:YAG-laser or a Nd:YAG-laser with its original wavelength of 1064 nm. Individual lines of an argon ion laser or a diode laser may also be used for laser cutting and material ablation. The individual positions for processing via laser beams can be approached by a scanner system. According to other embodiments the use of pulsed laser beams is possible in order to optimize the removal behavior.

Using these methods very fine structures can be realized (approx. 50 μm) at high aspect ratios and angles of edges ranging from 5 to 7°.

For the further optimization a laser device with VUV laser radiation can be used to produce via precision removal. A fluorine laser has a wavelength of $\lambda$=157 nm, for example. Using this wavelength a controlled depth ablation ranging from 100 nm resolution and a processing of materials is possible, which can hardly be structured with conventional methods.

Exemplary embodiments also address the described test devices, contact units, test bases, and parts tested by the methods for testing parts. Here, these parts can perhaps be identified by the imprints left by the contact guides of the part.

While the above-described facts relate to embodiments other embodiments may also be deducted therefrom without deviating from the range of the invention defined by the claims.

LIST OF REFERENCE CHARACTERS

Contact unit for a device to place a part into operation, testing device, and method for initial operation of and testing a part

| | |
|---|---|
| 10 | part |
| 12 | connection element |
| 100 | testing device |
| 110 | circuit board |
| 120 | base plate |
| 122 | opening |
| 124 | plunger |
| 126 | contact wall |
| 130 | fixation unit |
| 140 | contact guide |
| 140' | contact guide |
| 142 | connection unit |
| 144 | line |
| 146 | alignment unit |
| 30 | part |
| 330 | fixation unit |
| 340' | contact guide |
| 440 | contact unit |
| 440' | contact guide |
| 441 | angled part |
| 442 | connection element |
| 443 | horizontal part |
| 444 | predetermined breaking point |
| 446 | alignment units |
| 510 | provide contact unit |
| 511 | adjusting |
| 512 | provide part |
| 513 | fixation |
| 514 | removing connection unit |
| 515 | contacting |
| 516 | testing |

What is claimed is:

1. A contact unit adjusted in order to create an electric contact comprising: an arrangement of contact guides; and a connection unit, which connect the contact guides with each other, with the contact unit comprising at least one predetermined breaking point, which is arranged to interrupt an electric contact between the contact guides of the arrangement or contact guides.

2. The contact unit according to claim 1, wherein the arrangement of contact guides and the connection unit are embodied in one piece.

3. The contact unit according to claim 1, wherein the predetermined breaking point is a predetermined breaking point embodied by laser cutting.

4. The contact unit according to claim 1, wherein the arrangement of contact guides includes at least 8 contact guides, preferably at least 17 contact guides.

5. The contact unit according to claim 1, wherein the arrangement of contact guides and the connection unit being made form a material including spring steel or copper beryllium.

6. The contact unit according to claim 1, further comprising: an alignment unit adjusted to align the contact element in a device for initial operation.

7. The contact unit according to claim 1, wherein the alignment unit comprises at least one bore inside the connection unit.

8. The contact unit according to claim 1, wherein the arrangement of contact guides have a contact guide thickness of the contact guides ranging from 80 μm to 200 μm.

9. The contact unit according to claim 1, wherein the predetermined breaking point includes a material ablation of the contact guide thickness ranging from 30% to 70%.

10. The contact unit according to claim 1, wherein the arrangement of contact guides is connected to a first end via a connection unit and the contact guides of the arrangement of contact guides being bent at an opposite end.

11. A device for placing an electric part in operation comprising a contact unit adjusted in order to create an electric contact comprising: an arrangement of contact guides; and a connection unit, which connect the contact guides with each other, with the contact unit comprising at least one predetermined breaking point, which is arranged to interrupt an electric contact between the contact guides of the arrangement or contact guides.

12. A test base for producing an electric contact between an electronic part and a board comprising a contact unit comprising: an arrangement of contact guides and a connection unit connecting the contact guides with each other, with the arrangement of contact guides and the connection unit being embodied in one piece, wherein the contact unit is provided with a predetermined breaking point, in order to interrupt an electric contact of the contact guides of the arrangement of contact guides.

13. The test base according to claim 12, wherein the predetermined breaking point is a predetermined breaking point embodied by laser radiation.

14. The test base according to claim 12, further comprising: including an alignment unit adjusted to align the contact unit in the test base.

15. The test base according to claim 12, wherein the predetermined breaking point includes a material ablation of the contact guide thickness ranging from 30% to 70%.

16. The test base according to claim 12, further comprising: a contact guide-fixation unit adjusted to press the contact guides to a contact of a circuit, with the contact guide-fixation unit being made from an insulating elastomer.

17. The test base according to claim 16, wherein the contact guide-fixation unit being arranged at a base plate of the test base, and the base plate being adjusted for the circuit board to be arranged for testing.

18. The test base according to claim 12, further comprising: a plunger with a part contacting unit, with the plunger being arranged in a mobile fashion in reference to the base plate and the part contacting unit is adjusted to create a contact between the contacts of the electronic part and the contact guides of the arrangement of contact guides.

19. A component, being tested using the steps of:

arranging an arrangement of contact guides in a device for initiation, pressing the arrangement of contact guides onto a circuit board, separating the contact guides of the arrangement of contact guides, contacting the part with the contact guides, and putting the part in operation;

and/or a device for placing an electric part in operation comprising a contact unit adjusted in order to create an electric contact comprising: an arrangement of contact guides; and a connection unit, which connect the contact guides with each other, with the contact unit comprising at least one predetermined breaking point, which is arranged to interrupt an electric contact between the contact guides of the arrangement or contact guides;

wherein the component has contact imprints caused on the contact elements of the component by the contact guides.

* * * * *